Dec. 31, 1963 B. P. GREEN 3,116,461

LINEAR AMPLIFIER FOR MODULATED HIGH FREQUENCY OSCILLATIONS

Filed Feb. 24, 1961

INVENTOR.
BERTRAM PAUL GREEN
BY
[signature]
AGENT

United States Patent Office 3,116,461
Patented Dec. 31, 1963

3,116,461

LINEAR AMPLIFIER FOR MODULATED HIGH FREQUENCY OSCILLATIONS

Bertram Paul Green, Hicksville, N.Y., assignor to North American Philips Company, Inc.
Filed Feb. 24, 1961, Ser. No. 91,471
5 Claims. (Cl. 330—109)

Figures 1, 2:
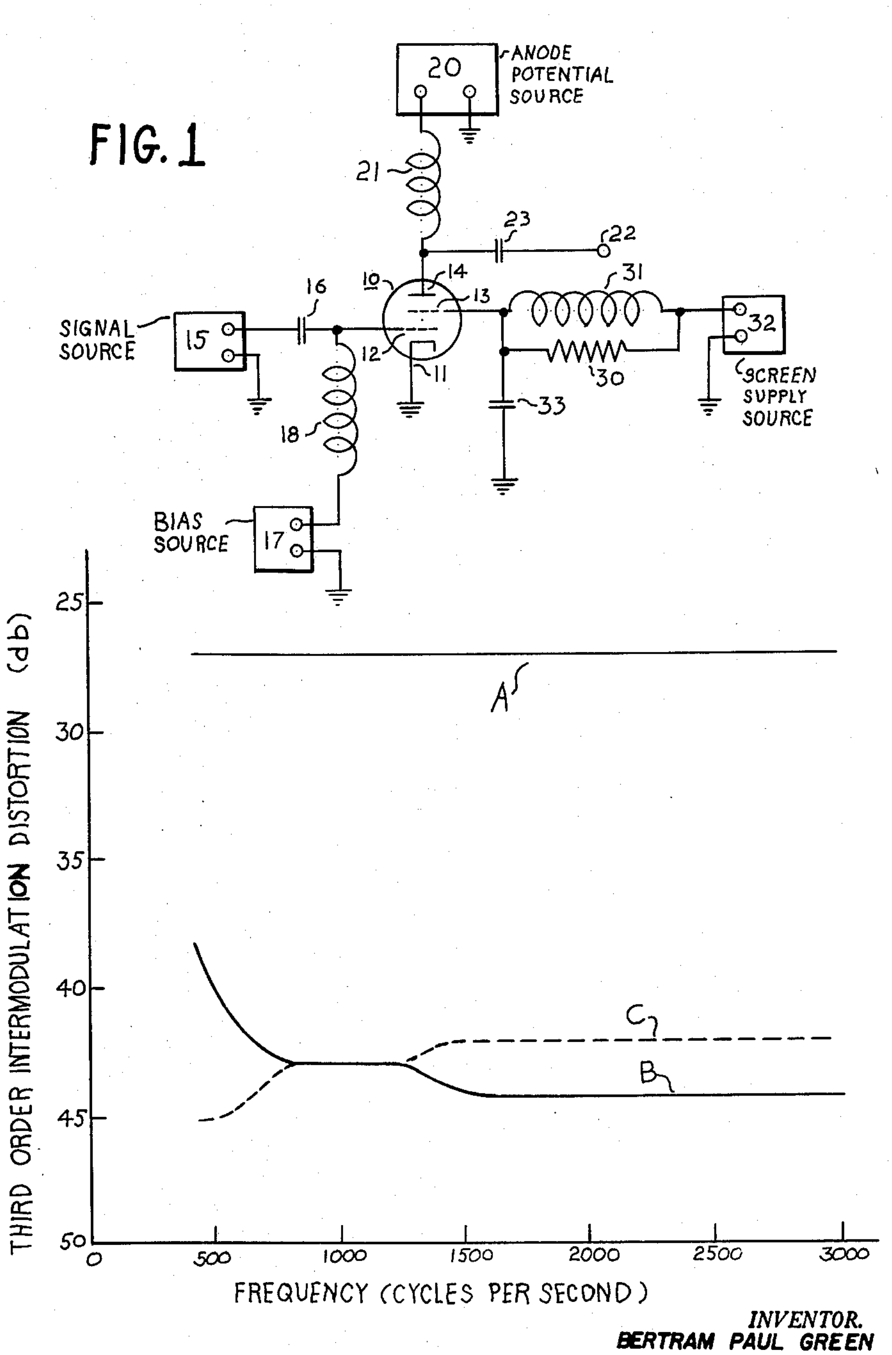

This invention relates to linear amplifiers, and more in particular, to means for improving the linearity of an amplifier for amplifying signals having low frequency information signals modulated on a high frequency carrier. Such amplifiers are employed, for example, in systems for the transmission and reception of single sideband signals, wherein distortion resulting from non-linear characteristics must be avoided in order to eliminate interference in adjacent channels. It will be obvious, however, that the invention is not limited to such applications.

When multigrid electron discharge tubes are employed as amplifying devices, a non-linear relationship between a signal voltage applied to the control electrode and the output current may arise due to the characteristics of the tubes. For example, the constant current characteristics of typical multigrid tubes with constant screen voltage show that, in the region of anode current cutoff the variation in anode current with variations in control grid voltage are much less than in the intermediate control grid voltage region. A further region exists, at high control grid voltages, in which the variation in anode current with variations in control grid voltage are also less than in the intermediate grid voltage region, due to curvature in the anode current characteristics at low plate voltages.

While improved linearity of amplification may be achieved by operating the amplifier only in the region of intermediate control grid voltages, this type of operation is undesirable since the lower bias required increases the plate dissipation of the tube, and the efficiency of the amplifier stage is reduced. The improvement in linearity obtainable in this manner is also limited, since an appreciable amount of non-linearity between the control grid voltage and anode current exists even in the intermediate bias operating regions.

The linearity of amplication may also be improved by employing degenerative feedback. In previous systems of this type the distortion in an amplifying stage was compensated for by feeding a portion of the radio frequency signal of the amplifier stage back to a preceding stage, thereby introducing compensatory distortion in the preceding stage. While substantial improvement in linearity may be obtained in this manner, care must be exercised in the installation of the feedback leads since they carry a radio frequency signal, and since feedback is required between the stages the addition of amplification stages to obtain higher power output is made more difficult.

It is therefore an object of this invention to provide a simple and more economical linear amplifier.

Another object is to provide means for improving the linearity of an amplifier without employing interstage feedback circuits, so that the addition of amplifier stages to increase the power output of a system may be simplified.

A further object of my invention is to provide means for improving the linearity of an amplifier without sacrificing the stage efficiency or increasing the plate dissipation by operating the stage at a reduced control grid bias.

According to my invention, a linear amplifier is provided for amplifying a signal of the type having low frequency intelligence, such as an audio signal, modulated on a high frequency carrier. The amplifier comprises an electron discharge device having a cathode, a first control electrode, at least one auxiliary control electrode, such as a screen grid or suppressor grid, and an anode. The modulated high frequency oscillations are applied to the first control electrode, and an output circuit is connected to the anode in the conventional manner. The auxiliary grid circuit, however, is made sufficiently degenerative to the modulation envelope that the anode current varies linearly with the first control electrode voltage.

In order to make the auxiliary or screen grid circuit degenerative, a parallel circuit of an inductor and resistor is connected in series with the screen grid circuit, and a by-pass capacitor is connected between the screen grid and a reference potential. The reactance of the capacitor is chosen so as to present as high an impedance as possible within the range of modulation frequencies while still presenting a low impedance at the carrier frequency. The reactance of the inductor is chosen so that it is equal to that of the capacitor at the center of the modulation frequency range. That is, the capacitor and the inductor form a resonant circuit at the middle of the modulation frequency range and this resonant circuit in conjunction with the resistor should have a very low Q in order to keep the degeneration constant throughout the modulation frequency range.

While the specification concludes with claims particularly pointing out and distinctly claiming the subject matter which I regard as my invention, it is believed that the invention will be better understood from the following description taken in connection with the accompanying drawing.

In the drawing:

FIG. 1 is a circuit diagram illustrating one embodiment of a linear amplifier according to my invention; and FIG. 2 is a set of curves illustrating the third order intermodulation distortion products with and without the screen grid degeneration circuit of FIG. 1.

Referring now to FIG. 1, therein is illustrated an amplifier comprising an electron discharge tube 10 having a cathode 11, a control grid 12, an auxiliary control electrode, such as a screen grid 13, and an anodoe 14. A signal source 15 of low frequency intelligence signals modulated on a high frequency carrier is applied to the control grid 12 by way of coupling capacitor 16. A source of bias voltage 17 of suitable value is connected to the control grid 12 by way of an impedance 18.

The anode 14 is connected to a source 20 of anode potential by way of an impedance 21 and an output terminal 22 may be connected to the anode by way of a coupling capacitor 23.

A parallel combination of a resistor 30 and inductor 31 is connected between the screen grid and a source 32 of screen supply voltage, and a bypass capacitor 33 is connected between the screen grid and cathode.

The inductor 31 and screen bypass capacitor 33 are effectively in parallel since the screen supply source 32 should have very low impedance to frequencies of the low frequency intelligence signals. The value of the inductor 31 is chosen so that the resonant frequency of the combination of inductor 31 and capacitor 33 falls within the range of the low frequency intelligence signals. For example, if the low frequency intelligence signals comprise the speech frequency spectrum of 300 to 3000 cycles, the resonant frequency of the inductor and capacitor may be approximately 1500 cycles.

The reactance of the capacitor is chosen so as to present as high an impedance as possible within the range of modulation frequencies while still presenting a low impedance at the carrier frequency. The reactance of the inductor is chosen so that it is equal to that of the capacitor at the center of the modulation frequency range. That is, the capacitor and the inductor form a resonant circuit at the middle of the modulation frequency range and this resonant circuit in conjunction with the resistor should have a very low Q in order to keep the degeneration constant throughout the modulation frequency range. The resistor 30 will determine the degeneration that occurs at the screen grid in the range of the low frequency intelligence signals. The resistor 30 may thus be selected to provide the desired amount of degeneration in the amplifier to make the control grid voltage anode current characteristic as linear as possible. The screen voltage may vary with the level of the low frequency intelligence signals above and below the direct current level, since the direct current impedance of the inductor 31 is relatively low. By employing only envelope degeneration, the average screen grid voltage does not vary, and therefore the power loss which would result if the circuit was degenerative to radio frequencies does not occur. No adjustment of the components is necessary for changes in carrier frequency. It has also been found that by employing the system of the invention, a material reduction in screen grid dissipation is realized.

As distinguished from previous feedback systems in linear amplifiers, the degeneration at the screen grid effectively varies the characteristics of the tube so that the intermediate control grid voltage regions have more nearly the same anode current variations with grid voltage variations as the low control grid voltage regions. The effect of curvature of the anode current characteristics at high grid voltages is also reduced, since the anode current curves are expanded upwardly so that the curved portions of the characteristics need not be employed.

The selection of the screen grid resistor to obtain optimum degeneration is dependent upon many factors, such as the characteristics of the tube employed and the grid bias employed in a particular amplifier. In one method for determining the optimum value of the screen grid resistor, conventional two-tone signals were applied to the amplifier input, and the screen grid resistor was then adjusted until the third order intermodulation products at the amplifier output were at a minimum.

In one example of an amplifier according to my invention, a 6907 dual tetrode was connected as in FIG. 1 with both sections in parallel. The screen resistor was 4000 ohms, the screen inductance 7 henries, the screen bypass capacitor was 0.002 microfarad. The screen supply voltage was 225 volts, the plate supply voltage was 600 volts, the control grid bias voltage was −26 volts, and the control grid drive voltage had a peak of 24 volts. The carrier frequency was 7 megacycles. The third order intermodulation distortion product levels of this amplifier are shown in FIG. 2, wherein curve A shows that third order intermodulation distortion product when the screen resistor and inductor are omitted, curve B shows the third order intermodulation distortion products for the upper sideband when the screen resistor and inductor are employed, and curve C shows the third order intermodulation distortion products for the lower sideband when the screen resistor and inductor are employed. These curves show that, in the audio frequency range of 500–3000 c.p.s., the third order modulation distortion is improved from 12½ to 18 db when the screen resistor and inductor according to the invention are employed.

It will be understood, of course, that while the form of the invention herein shown and described constitutes the preferred embodiment of the invention, it is not intended herein to illustrate all of the equivalent forms or ramifications thereof. Thus, the amplifier disclosed in the preceding paragraphs is purely illustrative, and it will be obvious that modifications may be made without departing from the spirit and scope of the invention, and it is aimed in the appended claims to cover all such changes as fall within the true spirit and scope of the invention.

What I claim is:

1. A circuit for amplifying a signal of the type having low frequency signals modulated on a high frequency carrier, said circuit comprising an electron discharge device having a cathode, a control electrode, at least one auxiliary electrode, and an anode, means applying said signal between said control electrode and cathode, output circuit means connected to said anode, and means connecting said auxiliary electrode to said cathode comprising a parallel combination of a resistor, and an inductor, low impedance supply source means connected in series with said parallel combination and a capacitor connected in parallel with a least said parallel combination said capacitor and inductor being resonant within the range of said low frequency signals, said capacitor having negligible impedance at the frequency of said carrier, said parallel combination having a very low Q whereby degeneration is substantially constant throughout the range of said low frequency signals.

2. A circuit for amplifying a signal of the type having low frequency signals modulated on a high frequency carrier, said circuit comprising an electron discharge device having a cathode, a control electrode, at least one auxiliary electrode, and an anode, means applying said signal between said control electrode and cathode, output circuit means connected to said anode, and means connecting said auxiliary electrode to said cathode comprising a parallel combination of a resistor, and an inductor, low impedance supply source means connected in series with said parallel combination and a capacitor connected in parallel with at least said parallel combination the reactance of said capacitor being equal to the reactance of said inductor approximately in the center of the range of said low frequency signals, said capacitor having negligible impedance at the frequency of said carrier, said parallel combination having a very low Q whereby degeneration is substantially constant throughout the range of said low frequency signals.

3. A circuit for amplifying a signal of the type having low frequency signals of a predetermined frequency range modulated on a high frequency carrier, said circuit comprising an electron discharge device having at least a cathode, a control grid, a screen grid and an anode, means applying said signal between said control grid and cathode, output circuit means connected to said anode, a source of voltage, means connecting the negative terminal of said source to said cathode, means connecting the positive terminal of said source to said screen grid comprising a parallel circuit of an inductor and a resistor, and capacitance means connected between said screen grid and cathode, said capacitor and inductor being resonant approximately at the center of said predetermined frequency range, said capacitor having negligible impedance at the frequency of said carrier, said parallel circuit having a very low Q whereby degeneration is substantially constant throughout said frequency range.

4. An amplifier for single sideband signals comprising an electron discharge tube having at least a cathode, a control grid, a screen grid, and an anode, means applying said signals between said control grid and cathode, output circuit means connected to said anode, a low impedance source of screen grid supply voltage, means connecting said source to said cathode, and means providing screen degeneration for signals of the frequency range of the modulation envelope of said single sideband signals and for bypassing signals of the frequency of said single sideband signals connecting said screen grid to said source of supply voltage, whereby distortion resulting from non-linear characteristics of said tube is substantially eliminated.

5. An amplifier for single sideband signals comprising an electron discharge tube having at least a cathode, a control grid, a screen grid, and an anode, means applying said signals between said control grid and cathode, output circuit means connected to said anode, a low impedance source of screen grid supply voltage, a parallel circuit of a resistor and inductor connected between said screen grid and the positive terminal of said source, capacitor means connected between said screen grid and the negative terminal of said source, means connecting said negative terminal to said cathode, the reactance of said capacitor means being low at the carrier frequency of said single sideband signals and being equal to the reactance of said inductor within the range of modulation frequencies of said single sideband signals, said parallel circuit having a very low Q whereby degeneration is substantially constant throughout said range of modulation frequencies.

References Cited in the file of this patent

UNITED STATES PATENTS

| | | |
|---|---|---|
| 2,097,896 | Salzberg | Nov. 2, 1937 |
| 2,212,205 | Hepp | Aug. 20, 1940 |
| 2,547,145 | Adler | Apr. 3, 1951 |
| 2,554,457 | Dome | May 22, 1951 |
| 2,710,312 | Hafler et al. | June 7, 1955 |